(12) United States Patent
Woo et al.

(10) Patent No.: US 8,513,653 B2
(45) Date of Patent: Aug. 20, 2013

(54) ELECTRONIC DEVICE USING A TWO-DIMENSIONAL SHEET MATERIAL, TRANSPARENT DISPLAY AND METHODS OF FABRICATING THE SAME

(75) Inventors: Yun-sung Woo, Suwon-si (KR); Sun-ae Seo, Hwaseong-si (KR); Dong-chul Kim, Suwon-si (KR); Hyun-jong Chung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 352 days.

(21) Appl. No.: 12/923,163

(22) Filed: Sep. 7, 2010

(65) Prior Publication Data

US 2011/0089403 A1   Apr. 21, 2011

(30) Foreign Application Priority Data

Oct. 21, 2009 (KR) .................. 10-2009-0100307

(51) Int. Cl.
*H01L 29/08* (2006.01)
*H01L 21/00* (2006.01)

(52) U.S. Cl.
USPC .......... 257/40; 257/59; 257/72; 257/E51.006; 257/E51.007; 438/82; 438/151

(58) Field of Classification Search
USPC .............. 257/40, 59, 72, E51.006, E51.007; 438/82, 151
See application file for complete search history.

(56) References Cited

U.S. PATENT DOCUMENTS

| 6,492,659 | B1 | 12/2002 | Yamazaki |
| 8,124,463 | B2 * | 2/2012 | Chen et al. ................. 438/149 |
| 2009/0071533 | A1 | 3/2009 | Choi et al. |
| 2009/0146111 | A1 | 6/2009 | Shin et al. |
| 2010/0025660 | A1 * | 2/2010 | Jain et al. ..................... 257/24 |
| 2010/0051907 | A1 * | 3/2010 | Pfeiffer ......................... 257/29 |
| 2012/0168724 | A1 * | 7/2012 | Park et al. ..................... 257/29 |

FOREIGN PATENT DOCUMENTS

| JP | 57-67913 | 4/1982 |
| KR | 2001-0020826 | 3/2001 |
| KR | 10-2009-0028007 | 3/2009 |
| KR | 10-2009-0059871 | 6/2009 |
| WO | WO 2009/023051 | 2/2009 |

* cited by examiner

*Primary Examiner* — Minh-Loan T Tran

(74) *Attorney, Agent, or Firm* — Harness, Dickey & Pierce, P.L.C.

(57) ABSTRACT

An electronic device, a transparent display and methods for fabricating the same are provided, the electronic device including a first, a second and a third element each formed of a two-dimensional (2D) sheet material. The first, second, and third elements are stacked in a sequential order or in a reverse order. The second element is positioned between the first element and the third element. The second element has an insulator property, the first and third elements have a metal property or a semiconductor property.

23 Claims, 9 Drawing Sheets

US 8,513,653 B2

ELECTRONIC DEVICE USING A TWO-DIMENSIONAL SHEET MATERIAL, TRANSPARENT DISPLAY AND METHODS OF FABRICATING THE SAME

CROSS-REFERENCE TO RELATED APPLICATIONS

This application claims the benefit of priority under 35 U.S.C. §119 from Korean Patent Application No. 10-2009-0100307, filed on Oct. 21, 2009, in the Korean Intellectual Property Office, the disclosure of which is incorporated herein in its entirety by reference.

BACKGROUND

1. Field

Example embodiments relate to an electronic device, a transparent display having an electronic device and methods for fabricating the same. Other example embodiments relate to an electronic device formed by using a two-dimensional (2D) sheet material, a transparent display having the electronic device and methods of fabricating the same.

2. Description of the Related Art

Graphene is a single-layered structure material, which is a two-dimensional (2D) sheet material formed of carbon atoms in a hexagonal lattice structure. Graphene is chemically stable, and has a semi-metal characteristic in which a conduction band and a valance band overlap at one point (the Dirac point). Graphene also has a 2D ballistic transport characteristic. The fact that a charge is 2D ballistic-transported in a material means that the charge is transported almost without having resistance due to scattering. Mobility of the charge in graphene is significantly high. In addition, graphene has a characteristic of having a current density (about 108 A/cm$^2$) that is about 100 times greater than that of copper.

Due to such characteristics of graphene, research focused on applying graphene to an electronic device is been conducted.

SUMMARY

Example embodiments relate to an electronic device, a transparent display having an electronic device and methods for fabricating the same. Other example embodiments relate to an electronic device formed by using a two-dimensional (2D) sheet material, a transparent display having the electronic device and methods of fabricating the same.

Provided are an electronic device and methods for fabricating the electronic device by applying a two-dimensional (2D) sheet material to all (or each) of a gate electrode, an insulating layer and an active channel.

Additional aspects will be set forth in part in the description which follows and, in part, will be apparent from the description, or may be learned by practice of the presented example embodiments.

According to example embodiments, an electronic device includes a first element, a second element and a third element formed of two-dimensional (2D) sheet materials, wherein the first, second and third elements are stacked in a sequential order, or in a reverse order. The second element is positioned between the first element and the third element. The second element has an insulator property. The first and third elements have one of a metal property and a semiconductor property.

The second element may include a graphene oxide or a hexagonal boron nitride (hBN).

The first and third elements may include at least one graphene layer.

One of the first element and the third element may be formed to include at least one layer of graphene and to have a metal property, and the other of the first element and the third element is formed to include a graphene monolayer and to have a semiconductor property.

The graphene monolayer may have a nanoribbon shape.

The electronic device may have a transistor structure in which the first element indicates (or represents) a gate electrode formed to exhibit the metal property, the second element indicates (or represents) an insulating layer, and the third element indicates (or represents) an active channel formed to exhibit the semiconductor property.

The gate electrode may include at least one layer of graphene.

The insulating layer may include a graphene oxide or a hBN.

The active channel may include a channel region formed by allowing a graphene monolayer to have a nanoribbon shape.

The gate electrode may include at least one layer of graphene. The insulating layer may include a graphene oxide or a hexagonal boron nitride (hBN). The active channel may include a channel region formed by allowing a graphene monolayer to have a nanoribbon shape.

The gate electrode may be formed of a graphene multilayer that exhibits a transparency characteristic (or is transparent). The insulating layer may be formed to exhibit a transparency.

The gate electrode, the insulating layer and the active channel may be formed on a transparent substrate.

The first element may be formed of graphene having at least one layer that exhibits a transparent characteristic (or is transparent). The second element may be transparent.

One of the first element and the third element may be formed to include at least one layer of graphene and to have the metal property, and other of the first element and the third element may be formed to include the graphene monolayer and to have the semiconductor property.

According to example embodiments, a transparent display including a transparent substrate and a transistor formed on the transparent substrate is provided. The transistor includes a gate electrode formed on the transparent substrate by using a two-dimensional (2D) sheet material so as to exhibit a metal property and to be transparent. An insulating layer is formed on the gate electrode by using a 2D sheet material so as to exhibit an insulator property and to be transparent. An active channel is formed on the insulating layer by using a 2D sheet material so as to exhibit a semiconductor property and to be transparent.

The gate electrode may include at least one layer of graphene that exhibits a transparent characteristic (or is transparent). The insulating layer may exhibit a transparent characteristic (or may be transparent) and may include a graphene oxide or a hexagonal boron nitride (hBN). The active channel may include a channel region formed by allowing a graphene monolayer to have a nanoribbon shape.

According to example embodiments, a method of fabricating an electronic device by stacking a first element, a second element and a third element in a sequential, or reverse, order is provided. The method includes depositing a transition metal thin film on a wafer substrate, depositing a two-dimensional (2D) sheet material layer on the transition metal thin film, coating a transfer substrate on the 2D sheet material layer, separating the 2D sheet material layer from the wafer substrate by removing the transition metal thin film and the wafer substrate, adhering the transfer substrate covered by the 2D sheet material layer to a target substrate, and removing the transfer substrate to form the first element on the target substrate. The above steps may be repeated to stack the second element on the first element, and repeated again to stack the third element on the second element.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1A:
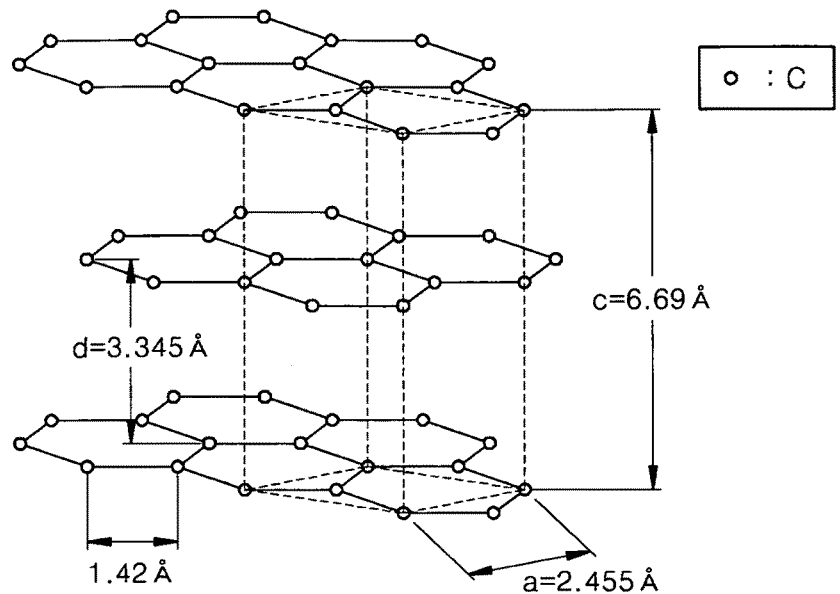
FIGS. 1A and 1B are diagrams of crystalline structures of a graphite and a hexagonal boron nitride (hBN), respectively, each of which formed of three two-dimensional (2D) sheets.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited-to example embodiments described.

Example embodiments relate to an electronic device, a transparent display having an electronic device and methods for fabricating the same. Other example embodiments relate to an electronic device formed by using a two-dimensional (2D) sheet material, a transparent display having the electronic device and methods of fabricating the same.

A graphene is a single-layered structure material, which is a two-dimensional (2D) sheet material formed of carbon atoms in a hexagonal lattice structure. The 2D sheet material has various interesting physical properties. The graphene has metallic or semiconductor properties according to the number of layers, and widths.

For example, when the number of layers of the graphene is equal to or greater than about five (e.g., two layers, three layers, four layers, or six or more layers), the graphene may have the metallic property and exhibit the same excellent conductivity as a graphite. In the case of a nanoribbon that is formed as a graphene monolayer having a width of several tens of nanometers (nm), a bandgap is formed so that the nanoribbon exhibits a semiconductor property at a room temperature.

As described above, because graphene has a ballistic electron-transport characteristic, an effective mass of an electron may be about zero. Thus, it is possible to fabricate an electronic device (e.g., a transistor) having significantly large mobility. In addition, when chemical groupings of —OH, —OOH or the like are attached to a surface of the graphene via an acid treatment, a graphene oxide having an insulator property is obtained.

A hexagonal boron nitride (hBN), which is a material formed of a 2D sheet, also has the same hexagonal lattice structure as the graphene. Unlike the graphene, the hBN has a bandgap of several electron-volts (eV) such that the hBN exhibits an insulator property at a room temperature.

Several layers of a graphene layer are optically transparent, and exhibit an excellent mechanical property. According to research, the optical transparency of a graphene layer having five layers is about 90%.

The graphene layer has mechanical properties in which Young's modulus is about 1 TPa, and a critical strain is about 25%. Therefore, graphene is known as the most solid material having excellent elasticity.

Similarly in the case of the graphite, 2D sheets are applied so that the hBN has a three-dimensional (3D) material structure. Here, each of the 2D sheets forms a thickness of one atomic layer so that several layers of the hBN may be optically transparent. Similar to graphene, boron (B) and nitrogen (N) atoms are covalently bound to each other so as to form a honeycomb structure. Thus, the hBN may have an excellent mechanical property.

The 2D sheet material (e.g., the graphite, the hBN, or the graphene oxide) may be multi-layered so that a 3D material is formed.

Figure 1B:
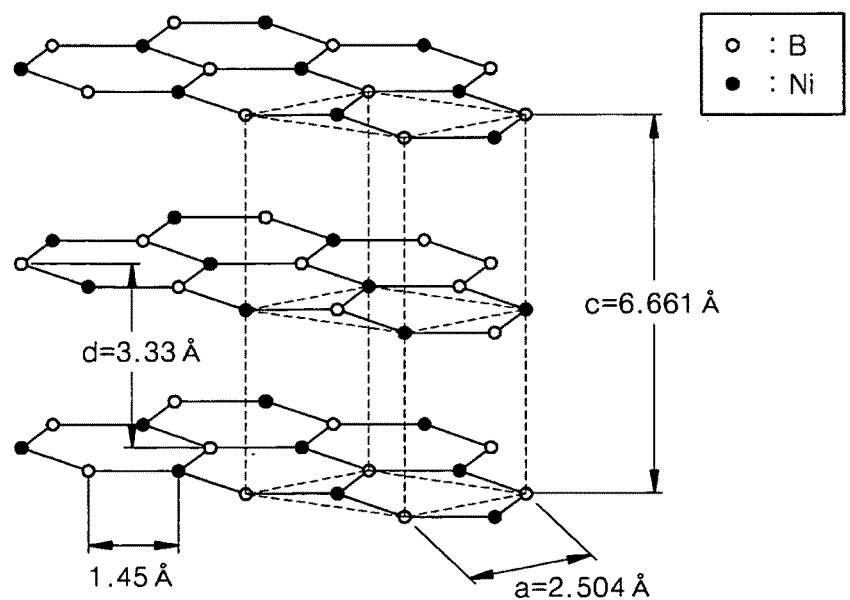

FIGS. 1A and 1B are diagrams of crystalline structures of a graphite and a hBN, respectively, each of which formed of three 2D sheets.

The graphite shown in FIG. 1A is formed of a plurality of 2D graphene sheets.

Referring to FIGS. 1A and 1B, it is possible to see that the crystalline structures of the graphene and the hBN are substantially similar to each other.

In a 3D material formed of multi-layered 2D sheets, one sheet (e.g., a graphene monolayer and a hBN sheet, which are respectively one atomic layer) may be easily grown on a transition metal (for example, including nickel (Ni), platinum (Pt), ruthenium (Ru), or Copper (Cu)) by chemical vapor deposition (CVD). The number of layers grown on the transition metal may be adjusted according to a thickness of a metal thin film, a deposition temperature and/or a hydrocarbon concentration.

Figure 2A:
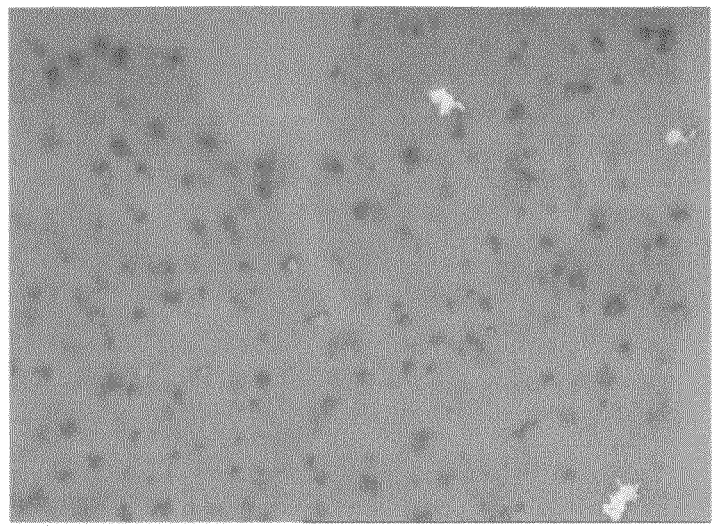
FIGS. 2A and 2B are a graphene monolayer deposited on a Ni thin film having a thickness of about 100 nm, and a Raman spectrum thereof, respectively.
Figure 2B:
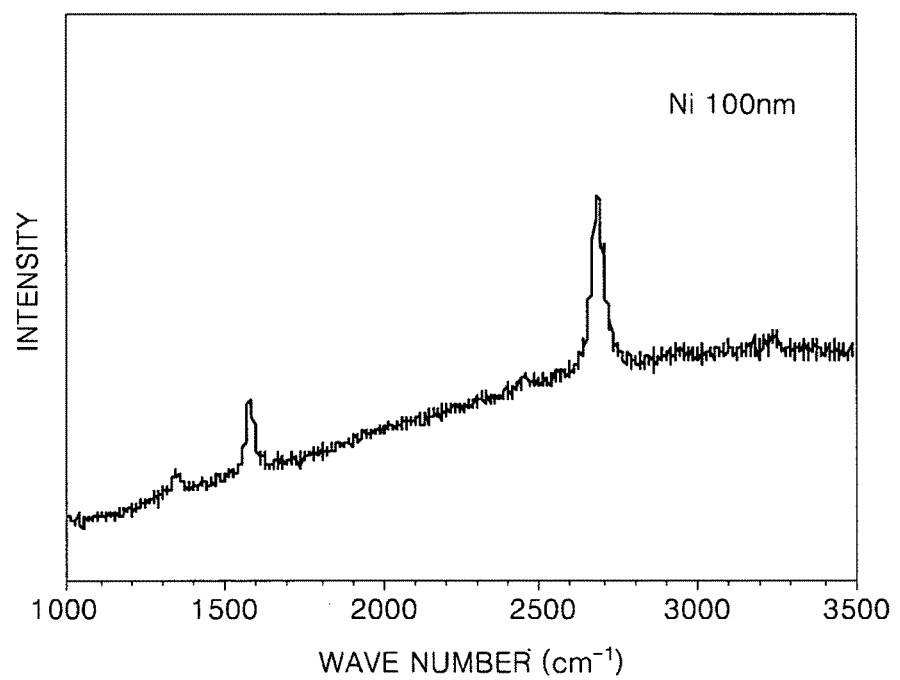

FIGS. 2A and 2B are a graphene monolayer deposited on a Ni thin film having a thickness of about 100 nm, and a Raman spectrum thereof, respectively.

Figure 3A:
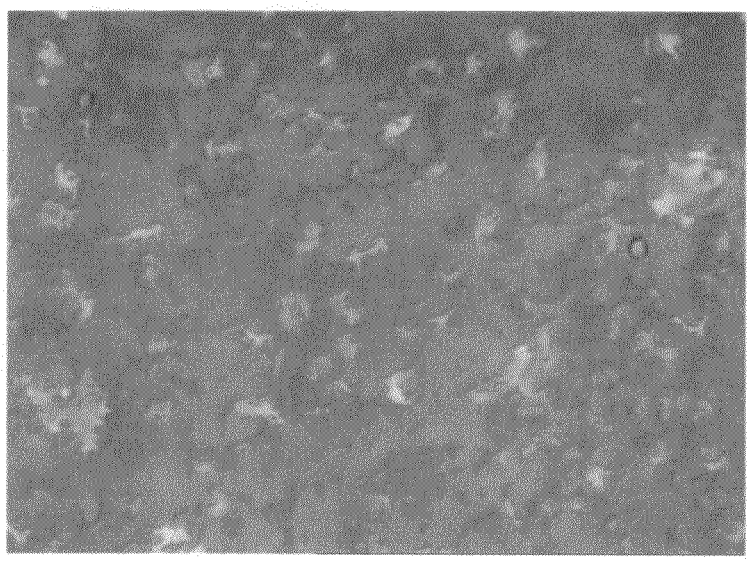
FIGS. 3A and 3B are a graphite deposited on a Ni thin film having a thickness of about 500 nm, and a Raman spectrum thereof, respectively.
Figure 3B:
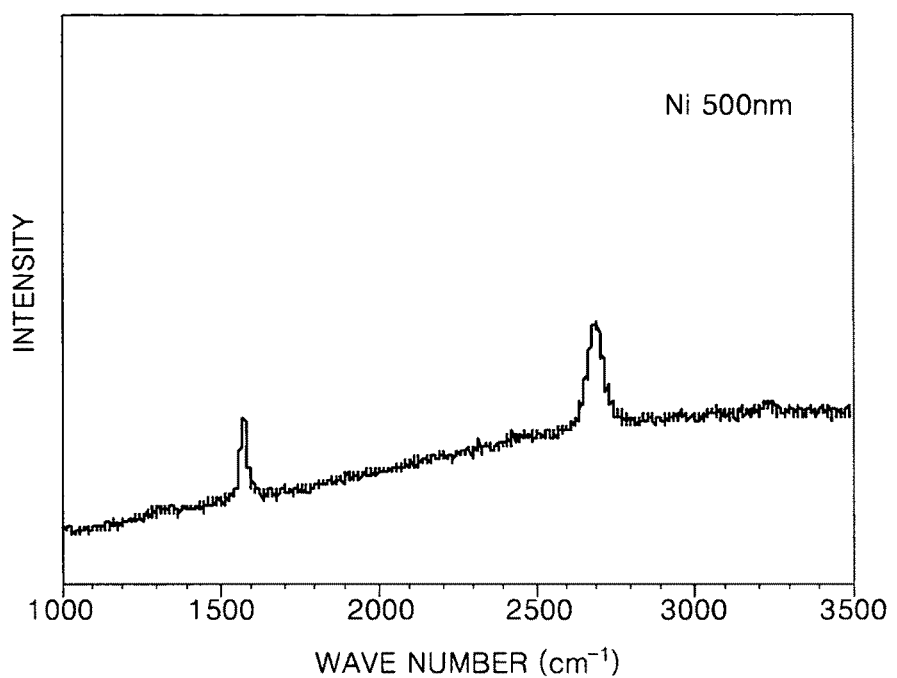

FIGS. 3A and 3B are a graphite deposited on a Ni thin film having a thickness of about 500 nm, and a Raman spectrum thereof, respectively.

Referring to FIGS. 2A through 3B, it is possible to see that the number of graphene layers may be adjusted according to the thickness of the Ni thin film.

As described above, a graphene multi-layer (i.e., the graphite), the graphene monolayer, the hBN or the graphene oxide respectively have a metal property, a semiconductor property and an insulator property at the room temperature.

Thus, if a gate electrode, an active channel and an insulating layer are formed by using the metal property, the semiconductor property, and the insulator property of the 2D sheet materials, then it is possible to fabricate the electronic device (e.g., a transistor), and a device using the transistor. Here, because the electronic device formed of the 2D sheets has a thickness corresponding to only several atomic layers, the electronic device is optically transparent and has an excellent mechanical property according to covalent bond in the atoms. In particular, it is possible to fabricate a transparent electronic device including a transistor capable of being bent, or folded, according to its excellent elasticity characteristic, or to fabricate a device including a transparent bendable, or foldable, display, by using the transparent electronic device.

An electronic device according to example embodiments includes first through third elements formed of 2D sheet materials. The first through third elements may be stacked in a sequential order, or a reverse order, so that the second element may be positioned between the first element and the third element. Here, the second element may have an insulator property, and the first and third elements may be formed to have a metal property or a semiconductor property.

Figure 4A:
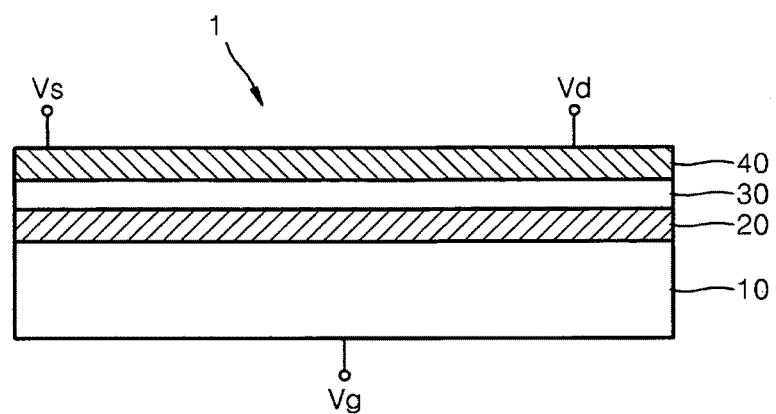
FIG. 4A is a cross-sectional view of an electronic device formed by using a 2D sheet material according to example embodiments.

FIG. 4A is a cross-sectional view of an electronic device formed by using a 2D sheet material according to example embodiments.

Figure 4B:
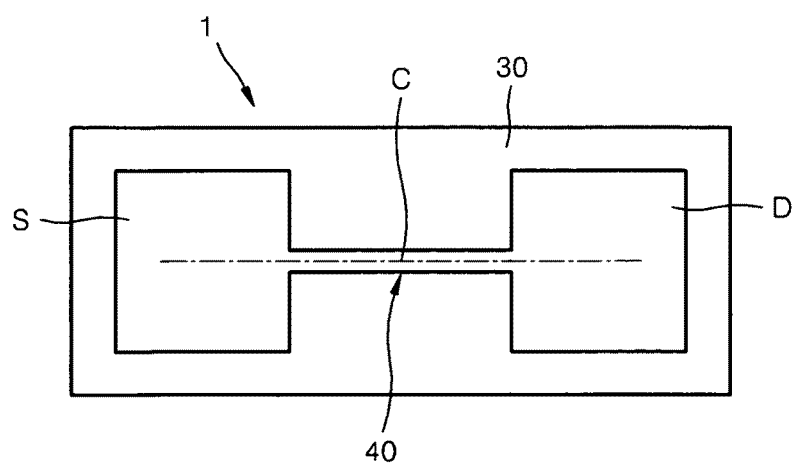
FIG. 4B is a plane view of the electronic device of FIG. 4A.

FIG. 4B is a plane view of the electronic device of FIG. 4A.

Hereinafter, an example of the electronic device will be explained with reference to FIGS. 4A and 4B, wherein the example is formed to have a transistor structure. That is, a first element is a gate electrode, a second element is an insulating layer, and a third element is an active channel. In the case where first through third elements are stacked on a substrate, a transistor having a bottom gate structure may be obtained. In the case where the first through third elements are stacked on the substrate in a reverse order, a transistor having a top gate structure may be obtained.

However, the electronic device according to example embodiments is not limited to the transistors, and thus may vary and be applied to various devices requiring a first through third elements stacked-structure (e.g., a gate electrode-insulating layer-active channel stacked structure).

Referring to FIGS. 4A and 4B, an electronic device 1 may include a gate electrode 20 as the first element, an insulating layer 30 as the second element, and an active channel 40 as the third channel on a substrate 10.

In FIGS. 4A and 4B, the electronic device 1 corresponds to a bottom-gate type in which the gate electrode 20 is between the active channel 40 and the substrate 10. In this case, a gate voltage $V_g$ is applied to the substrate 10. A source voltage $V_s$ and a drain voltage $V_d$ may be applied to source region S and drain region D, respectively.

In another example embodiment, the electronic device 1 may be formed to be a top-gate type in which the gate electrode 20 is positioned above the active channel 40. That is, instead of the gate electrode 20, the insulating layer 30, and the active channel 40 being sequentially formed on the substrate 10, they may be formed on the substrate 10 in a reverse order (i.e., the active channel 40, the insulating layer 30 and the gate electrode 20 may be sequentially formed on the substrate 10).

Although not shown, a structure of the top-gate type and a fabrication method thereof may be realized from the bottom-gate type electronic device that will be described in detail. Thus, illustrations and detailed descriptions for the top-gate type are omitted for the sake of brevity.

The substrate 10 may be a transparent substrate. In addition, the substrate 10 may be a flexible substrate.

The gate electrode 20, the insulating layer 30 and the active channel 40 may be formed of the 2D sheet material.

The gate electrode 20 may be formed by allowing a 2D sheet material to exhibit a metal property. As the gate electrode 20, a graphene multi-layer may be formed to exhibit the metal property. In addition, the gate electrode 20 may be transparent. For example, when the gate electrode 20 is formed of about five graphene layers, the gate electrode 20 exhibiting the metal property is capable of functioning as an electrode, while ensuring about 90% transparency.

The insulating layer 30 may be formed by allowing a 2D sheet material to exhibit an insulator property. The insulating layer 30 may be formed of a graphene oxide layer or a hBN layer, which are the 2D sheet materials that exhibit the insulator property.

The active channel 40 may be formed by allowing a 2D sheet material to exhibit a semiconductor property. For example, in order to obtain the active channel 40 as illustrated in FIG. 4B, a graphene monolayer may have a nanoribbon shape.

In FIG. 4B, the active channel 40, which is formed of the graphene monolayer having the nanoribbon shape, is patterned as a channel region C for exhibiting the semiconductor property. A source region S and a drain region D, which are relatively wider than the channel region C, are provided.

As described above, when the graphene multi-layer, the graphene monolayer, and the hBN or the graphene oxide are used as the gate electrode 20, the active channel 40 and the insulating layer 30, respectively, the electronic device 1 (e.g., a transistor) may use substantially high carrier mobility of the graphene so that it is possible to fabricate a device having an excellent performance, and being completely foldable or bendable. Also, because the gate electrode 20, the active channel 40 and the insulating layer 30 are formed of a 2D material having a thickness of several atomic layers, a total thickness of the device corresponds to several nanometers (nm) so that transparency of the device may significantly increase. Thus, it is possible to embody (or realize) a transparent display by using the electronic device 1, or to significantly increase an efficiency of a solar cell having the electronic device 1.

Hereinafter, a method of fabricating the electronic device will be described with reference to FIGS. 5A through 5D.

As described above, the graphene monolayer, the graphene multi-layer and the hBN layer may be deposited on a transition metal by CVD (e.g., thermal CVD or plasma enhanced-CVD (PE-CVD), molecular beam epitaxy (MBE), atomic layer deposition (ALD) or the like).

Figure 5A:
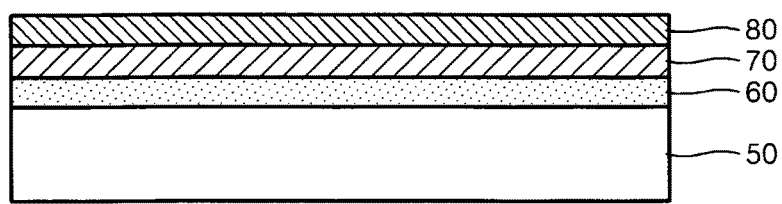
FIGS. 5A through 5D are diagrams for describing a method of fabricating an electronic device according to example embodiments.

Referring to FIG. 5A, a transition metal thin film 70 formed of nickel (Ni), platinum (Pt), ruthenium (Ru) or Copper (Cu) is deposited on a substrate 50 including a silicon wafer or the like. A 2D sheet material layer 80 is deposited thereon using a CVD method. As illustrated in FIG. 5A, a silicon oxide layer 60 may be formed on the silicon wafer substrate 50, and the transition metal thin film 70 and the 2D sheet material layer 80 may be deposited on the silicon oxide layer 60. The 2D sheet material layer 80 may include the graphene monolayer, the graphene multi-layer, and the graphene oxide or the hBN layer.

Figure 5B:
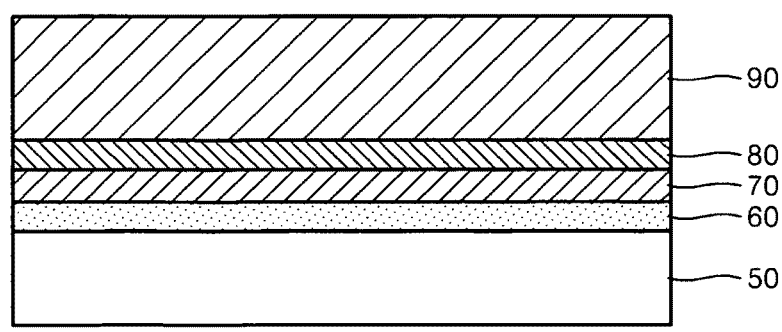
Figure 5C:
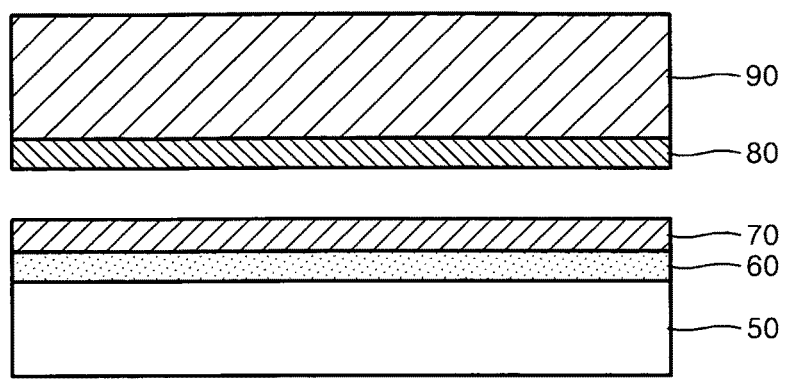
Figure 5D:
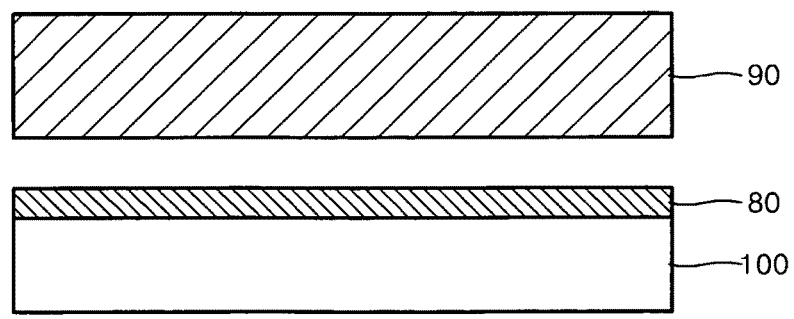

As shown in FIGS. 5B through 5D, after depositing the 2D sheet material layer 80 on the transition metal thin film 70, the 2D sheet material layer 80 is transferred from the silicon wafer substrate 50 to a target substrate 100 that is flexible and transparent by using a stamp printing method.

In more detail, as illustrated in FIG. 5B, a transfer substrate 90 (e.g., a polydimethylsiloxane substrate (a PDMS substrate)) is coated on the silicon wafer substrate 50 where the 2D sheet material layer 80 is deposited.

As illustrated in FIG. 5C, the 2D sheet material layer 80 is separated from the silicon wafer substrate 50 by removing the transition metal thin film 70, the silicon oxide layer 60, or the silicon wafer substrate 50 via etching. When the 2D sheet material layer 80 is separated from the silicon wafer substrate 50, only the 2D sheet material layer 80 is on the transfer substrate 90.

As illustrated in FIG. 5D, the transfer substrate 90 covered by the 2D sheet material layer 80 is adhered to the target substrate 100, and then the transfer substrate 90 is removed so that the 2D sheet material layer 80 is transferred to the target substrate 100. The 2D sheet material layer 80 may be patterned to be a desired device-shape after being transferred to the target substrate 100, or may be grown on a pre-patterned transition metal layer and then transferred.

Here, in the case of fabricating the bottom gate type electronic device shown in FIG. 4A, when the gate electrode 20 is formed, the target substrate 100 may correspond to the substrate 10, and the 2D sheet material layer 80 may correspond to the graphene multi-layer. When the insulating layer 30 is formed, the target substrate 100 may include the substrate 10 and the gate electrode 20 on the substrate 10, and the 2D sheet material layer 80 may correspond to the graphene oxide layer or the hBN layer. When the active channel 40 is formed, the target substrate 100 may include the substrate 10, and the gate electrode 20 and the insulating layer 30 on the substrate 10, and the 2D sheet material layer 80 may correspond to the graphene monolayer.

Thus, fabrication processes with reference to FIGS. 5A through 5D are repeated three times so as to form the electronic device 1 having a stack structure as shown in FIG. 4A, in which the gate electrode 20 corresponding to the graphene multi-layer, the insulating layer 30 corresponding to the graphene oxide layer or the hBN layer, and the active channel 40 corresponding to the graphene monolayer are formed on the substrate 10.

Figure 6A:
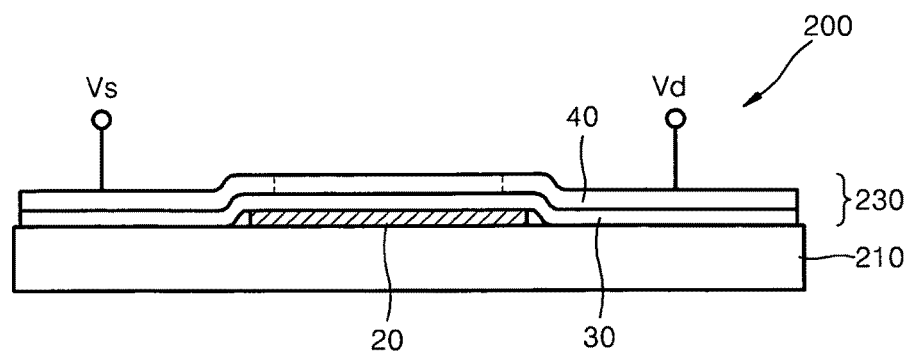
FIG. 6A is a diagram of an example in which the electronic device is applied as a transistor of a transparent display.

FIG. 6A is a diagram of an example in which the electronic device is applied as a transistor of a transparent display.

Figure 6B:
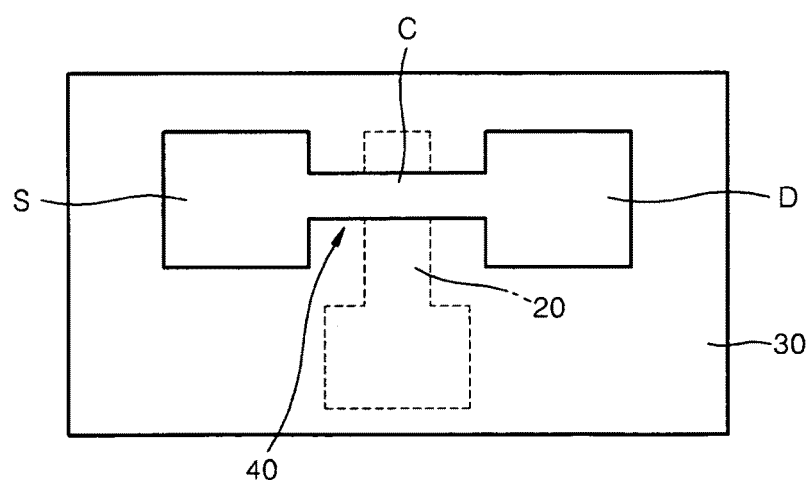
FIG. 6B is a plane view of the example of FIG. 6A.

FIG. 6B is a plane view of the example of FIG. 6A.

Here, elements that are materially the same as those in FIGS. 4A and 4B are indicated using the same reference numerals, and thus descriptions thereof are omitted.

Referring to FIGS. 6A and 6B, a transparent display 200 includes a transparent substrate 210 that is formed of a glass, a transparent plastic or a flexible transparent material. A transistor 230, which is transparent, is formed on the transparent display 200.

The transparent transistor 230 is formed in a similar, or materially identical, manner as the electronic device 1 that is described with reference to FIG. 4A, except that the gate electrode 20 shown in FIGS. 6A and 6B is patterned (or configured) for driving using pixels of the transparent display 200. As illustrated in FIG. 6B, in the transparent display 200, the gate electrode 20 may be patterned in such a manner that the gate electrode 20 may cross (or intersect) the active channel 40 only in the channel region C. The gate electrode 20 may be configured to perform a driving operation using pixels. Here, the gate electrode 20, the insulating layer 30, and the active channel 40 may be transparent so as to obtain the transparent transistor 230.

When the gate electrode, the insulating layer and the active channel of the electronic device (i.e., the transistor) are formed by using the 2D sheet materials, a thickness of the electronic device formed of the 2D sheet materials corresponds to only several atomic layers so that it is possible to embody (or realize) the electronic device (e.g. the transistor) that is not only optically transparent but also is bendable or foldable due to its excellent elasticity. By using the electronic device, it is possible to embody (or realize) a transparent display, a foldable or bendable display or a high efficient solar cell.

As described above, when the flexible and transparent substrate is used, and the gate electrode, the insulating layer, and the active channel are formed by using the 2D sheet materials ensuring the transparency, the electronic device, (e.g., the transistor) may be applied to various types of devices requiring a transparent and foldable transistor. For example, the transistor may be applied to a foldable portable display, a flexible transparent display, a solar cell having an increased efficiency according to transparent and thin properties, or a similar device.

It should be understood that example embodiments described therein should be considered in a descriptive sense only and not for purposes of limitation. Descriptions of features or aspects within each embodiment should typically be considered as available for other similar features or aspects in other embodiments.

What is claimed is:

1. An electronic device, comprising:
a first element, a second element and a third element sequentially stacked on a substrate, each of the first, second and third elements being formed of at least one two-dimensional (2D) sheet material,
wherein the second element is between the first element and the third element,
the second element has an insulator property,
one of the first and third elements has a metal property and the other of the first and third elements has a semiconductor property, and
the one of the first and third elements having the metal property includes at least two stacked layers of the at least one 2D sheet material, and the other of the first and third elements having the semiconductor property is a monolayer.

2. The electronic device of claim 1, wherein the second element includes a graphene oxide or a hexagonal boron nitride (hBN).

3. The electronic device of claim 1, wherein the first and third elements each include at least one graphene layer.

4. The electronic device of claim 1, wherein the one of the first and third elements having the metal property includes at least two layers of graphene, and
the other of the first and third elements having the semiconductor property includes a graphene monolayer.

5. The electronic device of claim 4, wherein the graphene monolayer has a nanoribbon shape.

6. The electronic device of claim 1, wherein the electronic device has a transistor structure in which the first element represents a gate electrode that exhibits the metal property, the second element represents an insulating layer, and the third element represents an active channel that exhibits the semiconductor property.

7. The electronic device of claim 6, wherein the gate electrode includes at least two graphene layers.

8. The electronic device of claim 6, wherein the insulating layer includes a graphene oxide or a hexagonal boron nitride (hBN).

9. The electronic device of claim 6, wherein the active channel includes a channel region formed of a graphene monolayer having a nanoribbon shape.

10. The electronic device of claim 6, wherein the gate electrode includes at least two graphene layers,
the insulating layer includes a graphene oxide or a hexagonal boron nitride (hBN), and
the active channel includes a channel region formed of a graphene monolayer having a nanoribbon shape.

11. The electronic device of claim 10, wherein the gate electrode is formed of a graphene multi-layer that is transparent, and
the insulating layer is transparent.

12. The electronic device of claim 11, wherein the gate electrode, the insulating layer and the active channel are formed on a transparent substrate.

13. The electronic device of claim 1, wherein the first element is formed of a graphene multi-layer that is transparent, and
the second element exhibits a transparent characteristic.

14. The electronic device of claim 13, wherein the one of the first and third elements having the metal property includes at least two graphene layers, and
the other of the first and third elements having the semiconductor property includes a graphene monolayer.

15. The electronic device of claim 1, wherein the second element includes graphene oxide.

16. The electronic device of claim 1, wherein the one of the first and third elements having the metal property includes graphite.

17. A transparent display, comprising:
a transparent substrate; and
a transistor on the transparent substrate,
wherein, the transistor includes,
a gate electrode on the transparent substrate, the gate electrode being formed of at least two stacked layers of a first two-dimensional (2D) sheet material that exhibits a metal property and is transparent;
an insulating layer on the gate electrode, the insulating layer being formed of a second 2D sheet material that exhibits an insulator property and is transparent; and
an active channel on the insulating layer, the active channel being a monolayer formed of a third 2D sheet material that exhibits a semiconductor property and is transparent.

18. The transparent display of claim 17, wherein the first 2D sheet material of the gate electrode includes at least two layers of graphene that are transparent,
the second 2D sheet material of the insulating layer includes a graphene oxide or a hexagonal boron nitride (hBN), and
the active channel includes a channel region formed of the third 2D sheet material, the third 2D sheet material including a graphene monolayer having a nanoribbon shape.

19. The transparent display of claim 17, wherein the insulating layer includes graphene oxide.

20. The transparent display of claim 17, wherein the gate electrode includes graphite.

21. A method of fabricating an electronic device, comprising:
stacking a first element, a second element and a third element in a sequential or reverse order on a target substrate, the second element being between the first element and the third element,
wherein the second element has an insulator property,
one of the first and third elements has a metal property and the other of the first and third elements has a semiconductor property, the one of the first and third elements having the metal property including at least two stacked layers of the at least one 2D sheet material, and the other of the first and third elements having the semiconductor property being a monolayer, and
each of the first element, the second element and the third element is stacked by,
depositing a transition metal thin film on a wafer substrate,
depositing at least one two-dimensional (2D) sheet material layer on the transition metal thin film,
coating a transfer substrate on the 2D sheet material layer,
separating the 2D sheet material layer from the wafer substrate by removing the transition metal thin film and the wafer substrate,
adhering the transfer substrate covered by the 2D sheet material layer to the target substrate, and
removing the transfer substrate.

22. The method of claim 21, wherein the second element includes a graphene oxide or a hexagonal boron nitride (hBN).

23. The method of claim 21, wherein one of the first element and the third element is formed to include at least one layer of graphene and to have a metal property, and
the other of the first element and the third element is formed to include a graphene monolayer and to have a semiconductor property.

* * * * *